(12) United States Patent
Brandelero et al.

(10) Patent No.: US 11,955,539 B2
(45) Date of Patent: Apr. 9, 2024

(54) DEVICE AND METHOD FOR MANUFACTURING DEVICE

(71) Applicant: MITSUBISHI ELECTRIC CORPORATION, Tokyo (JP)

(72) Inventors: Julio Cezar Brandelero, Rennes (FR); Jeffrey Ewanchuk, Rennes (FR); Stefan Mollov, Rennes (FR)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 140 days.

(21) Appl. No.: 17/604,250

(22) PCT Filed: Mar. 27, 2020

(86) PCT No.: PCT/JP2020/015258
§ 371 (c)(1),
(2) Date: Oct. 15, 2021

(87) PCT Pub. No.: WO2020/246126
PCT Pub. Date: Dec. 10, 2020

(65) Prior Publication Data
US 2022/0208997 A1      Jun. 30, 2022

(30) Foreign Application Priority Data
Jun. 6, 2019 (EP) .................................. 19305731

(51) Int. Cl.
*H01L 29/66* (2006.01)
(52) U.S. Cl.
CPC .............................. *H01L 29/66992* (2013.01)
(58) Field of Classification Search
CPC ............... H01L 29/66992; H01L 41/09; H01L 41/0993; H01H 37/006; H01H 37/14; H01H 2037/008; H01H 9/547; H01H 9/54; G01K 5/58; B81B 2201/03; B81B 2201/038; B41J 2/1648; B60T 13/741
See application file for complete search history.

(56) References Cited

U.S. PATENT DOCUMENTS

| | | | | |
|---|---|---|---|---|
| 5,463,233 | A * | 10/1995 | Norling | H01H 1/0036 337/16 |
| 2009/0243133 | A1* | 10/2009 | Wong | B29C 48/914 264/40.6 |
| 2015/0340907 | A1* | 11/2015 | Lei | H02J 9/04 307/66 |
| 2018/0051511 | A1* | 2/2018 | Ranzi | E04F 10/02 |
| 2021/0127455 | A1* | 4/2021 | Sur | A61M 11/042 |

FOREIGN PATENT DOCUMENTS

JP     2013-215039 A     10/2013

OTHER PUBLICATIONS

Japanese Office Action dated Jun. 21, 2022 for Application No. 2021-565323, with an English translation.

* cited by examiner

*Primary Examiner* — Mohammad A Rahman
(74) *Attorney, Agent, or Firm* — Birch, Stewart, Kolasch & Birch, LLP (57) ABSTRACT

A device comprising a gate pad, a source pad and a passive actuator arranged to form a reversible mechanical and electrical connection between the gate pad and the source pad only if the temperature in the passive actuator exceeds a threshold value.

12 Claims, 4 Drawing Sheets

DEVICE AND METHOD FOR MANUFACTURING DEVICE

TECHNICAL FIELD

The invention relates to the field of electronic switches.

More precisely, the invention relates to a device for protecting an electronic switch from an over-temperature event.

The invention further relates to a method for manufacturing such a device.

BACKGROUND ART

The discussion of the background of the invention herein is included to explain the context of the invention. This is not to be taken as an admission that any of the material referred to was published, known or part of the common general knowledge at the priority date of any of the claims.

Electronic switches are made to work under a certain maximum junction temperature. Operation above this temperature may trigger a thermal runway condition that can lead to an irreversible catastrophic failure of the device. In some over-temperature events, temperature in an electronic switch may increase over 600° C. in a timeframe of about 10 µs.

Over-temperature events may be caused by different situations as: a defective cooling system, a short circuit far away of the electronic switch, a wrong control order causing a short circuit in a leg configuration, or operation of the device outside its specifications.

Reaction to an over-temperature event is usually mostly based on detecting the cause of the over-temperature event. Known ways to detect the cause of an over temperature event may include fuses, de-saturation circuits, monitoring gate current or gate-emitter voltage, or junction temperature sensors.

This approach requires a great number of sensors and actuators for each possible circumstance and possibly generates various false triggers. Moreover, this approach induces an inherent delay which is incompatible with the quick action required to efficiently protect the electronic switch.

None of the detection means known from the prior art allow reliably protecting an electronic switch from over temperature events while also making the electronic switch operational again once the cause of the over temperature event is repaired.

An object of the present invention is to provide means to overcome the abovementioned drawbacks.

SUMMARY OF INVENTION

To this end, the invention proposes a device comprising a gate pad, a source pad and a passive actuator arranged to form a reversible mechanical and electrical connection between the gate pad and the source pad only if the temperature in the passive actuator exceeds a threshold value.

Advantageously, the device according to the invention allows protecting an electronic switch from over temperature events thanks to the passive actuator, irrespective of what caused an over-temperature event. Indeed, the mechanical and electrical connection is formed between the gate pad and the source pad whenever the temperature in the passive actuator exceeds a threshold value.

Advantageously, the device according to the invention allows making the electronic switch operational again once the cause of the over temperature event is repaired. Indeed, the mechanical and electrical connection is reversible and is only formed if the temperature in the passive actuator exceeds a threshold value. Therefore, when the temperature in the actuator is below said threshold value, then there is no mechanical and electrical connection between the gate pad and the source pad.

According to further embodiments which can be considered alone or in combination, the device according to the invention may further comprise one or several of the following features according to any possible combination:

- the passive actuator comprises a thermally extensible conductive material extending at least from the source pad to the gate pad when the temperature in the passive actuator exceeds the threshold value; and/or
- the passive actuator is permanently connected and thermally coupled to the source pad; and/or
- a substrate for supporting the gate pad and the source pad, wherein the passive actuator extends from the substrate; and/or
- the passive actuator extends from the source pad; and/or
- the passive actuator is manufactured using microelectromechanical system technology; and/or
- an external circuit for detecting a connection state between the gate pad and the source pad and for generating a signal based on the connection state; and/or
- the passive actuator comprises two arms, each comprising a first and a second extremity, wherein the first extremities of each arm are connected together and the second extremities of each arm are each connected to a different point of the source pad; and/or
- heating means to maintain the passive actuator temperature above the threshold value under application of an actuator voltage above a predetermined level; and/or
- the heating means comprise a resistance for heating the passive actuator through Joule effect; and/or
- at least one arm of the passive actuator has a predetermined width related to the resistance for heating the actuator through Joule effect; and/or
- at least one arm of the passive actuator has a width comprised between 4 and 40 µm; and/or
- a plurality of passive actuators; and/or
- each passive actuator is arranged to form a reversible mechanical and electrical connection between the gate pad and the source pad only if the temperature in said passive actuator exceeds a respective threshold value which is different for each passive actuator.

The invention further concerns a method for manufacturing a device comprising a gate pad, a source pad and a passive actuator arranged to form a reversible mechanical and electrical connection between the gate pad and the source pad only if the temperature in the passive actuator exceeds a threshold value, the method comprising:

- providing a device comprising a transistor region;
- implanting a sacrificial oxide on part of a surface of the transistor region;
- metallizing the surface of the transistor region comprising the implanted sacrificial oxide to form the gate pad, the source pad and the passive actuator, the passive actuator extending over at least part of the sacrificial oxide; and
- removing the sacrificial oxide.

For a more complete understanding of the description provided herein and the advantages thereof, reference is now made to the brief descriptions below, taken in connection with the accompanying drawings and detailed description, wherein like reference numerals represent like parts.

DESCRIPTION OF EMBODIMENTS

Elements in the figures may be shown in generalized or schematic form in the interest of clarity and conciseness or for informational purposes. Elements in the figures have not necessarily been drawn to scale. For example, the dimensions of some of the elements in the figures may be exaggerated relative to other elements to help improve the understanding of the embodiments of the present invention.

Although making and using various embodiments are discussed in detail below, it should be appreciated that as described herein are provided many inventive concepts that may be embodied in a wide variety of contexts. Embodiments discussed herein are merely representative and do not limit the scope of the invention. It will also be obvious to one skilled in the art that all the technical features that are defined relative to a process can be transposed, individually or in combination, to a device and conversely, all the technical features relative to a device can be transposed, individually or in combination, to a process.

Figure 1A:
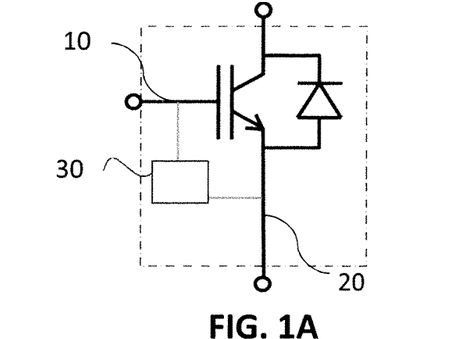
FIG. 1A depicts a schematic view of a device according to an embodiment of the invention.
Figure 1B:
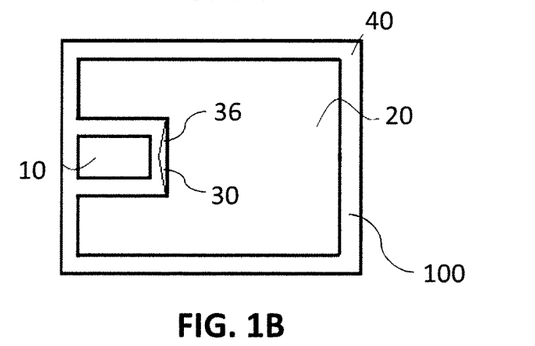
FIG. 1B depicts a top view of a device according to an embodiment of the invention at a normal operation temperature.
Figure 1C:
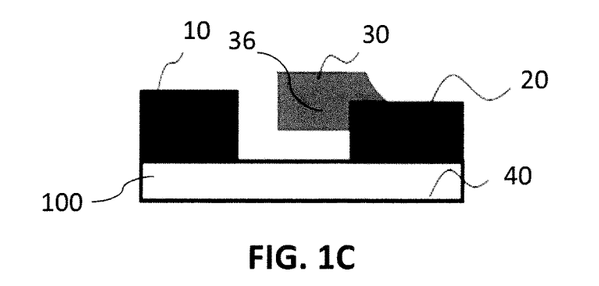
FIG. 1C depicts a side view of a device according to an embodiment of the invention at a normal operation temperature.

As represented in FIGS. 1A, 1B and 1C, the invention relates to a device comprising a gate pad 10, a source pad 20 and a passive actuator 30.

In the sense of the invention, the gate pad 10 and the source pad 20 are physical elements corresponding to, or being mechanically and electrically connected to, respectively the gate and the source or emitter of an electronic switch. The gate pad 10 and/or the source pad 20 may be formed on a substrate 40.

Embodiments of the invention may be applied to an electronic switch of various kinds, such as a field-effect transistor, having at least three terminals: respectively source, gate and drain, or emitter, gate and collector, the electronic switch being operably switchable between an open state and a closed state, the closed state corresponding to a zero voltage between the gate terminal and the source or emitter terminal.

In embodiments, the device may comprise a transistor region 100 comprising an electronic switch as defined above. Advantageously, the passive actuator 30 is a means for self-protection of the electronic switch from an over-temperature event.

In the sense of the invention, the passive actuator 30 refers to a physical component or mechanism adapted to control the device.

The wording "passive actuator 30" refers to an actuator adapted to operate and control the device without the need of an input electrical signal or power supply and without the need to be connected to any kind of external sensor or actioner to trigger the actuator. The passive actuator 30 is activated by its own temperature.

The passive actuator 30 is arranged to form a reversible mechanical and electrical connection between the gate pad 10 and the source pad 20 only if the temperature in the passive actuator 30 exceeds a threshold value.

In other words, as long as the temperature in the passive actuator 30 remains below, or equal to, the threshold value, the gate pad 10 and the source pad 20 are not mechanically or electrically connected to each other.

If the temperature in the passive actuator 30 increases from a first value below, or equal to, the threshold value to a second value above the threshold value, then, the passive actuator 30 simultaneously establishes a mechanical, or physical, connection, and an electrical connection between the gate pad 10 and the source pad 20. This mechanical and electrical connection remains as long as the temperature in the passive actuator 30 remains above the threshold value.

After that, if the temperature in the passive actuator 30 decreases below the threshold value, then the mechanical and electrical connection previously formed by the passive actuator 30 is disconnected.

The passive actuator 30 thus works as an on/off sensor whereby the on-state is above the threshold temperature value and the off-state is below, or equal to, the threshold temperature value.

Advantageously, as a result of the mechanical and electrical connection being formed passively above the threshold temperature value, the electronic switch is reliably protected from over-heating. Indeed, the electronic switch is desaturated.

Moreover, protection of the electronic switch is achieved as soon as the temperature in the passive actuator 30 rises above the threshold value, without any external circuitry. To the contrary, known systems and methods involve time requirements associated to first detecting a cause of an over temperature event and subsequently activating a protection.

Furthermore, thanks to the passive actuator 30 being responsive solely to temperature, risks of false triggers are very limited.

Advantageously, as a result of the mechanical and electrical connection being reversible, the electronic switch may automatically recover after an over-temperature event without the need for any detection of the temperature.

In embodiments, the threshold value is predetermined so as to be significantly greater than the operating temperature of the electronic switch and smaller than a temperature representing failure of the electronic switch, such as a creep temperature, deformation temperature, thermal runaway activation temperature or melting temperature. The threshold value may for instance be in the range of 250° C. to 500° C. Intermediate values include 300° C., 350° C., 400° C. or 450° C.

The passive actuator 30 may be of the type of electro-thermal actuators, that is a device generating motion by thermal expansion amplification. Such actuators may be self-heated from the current going through the actuator, thereby enabling its movement.

The passive actuator 30 may comprise a thermally extensible material 36, which elongates under heat, such as aluminum, titanium, gold, copper, silver or another metal.

The thermally extensible material 36 may be conductive and configured to extend at least from the source pad 20 until the gate pad 10 only when the temperature in the passive actuator exceeds the threshold value.

The passive actuator 30 may be permanently connected to the source pad 20. The passive actuator 30 may extend from the source pad 20 in the direction of the gate pad 10. In other words, the passive actuator 30 and the source pad 20 may be monolithic. In other words, the source pad 20 may itself comprise the passive actuator 30. Given its location, when the temperature in the passive actuator 30 is above the threshold value, the thermally extensible material 36 of the passive actuator 30 extends sufficiently towards the gate pad 10 to enter in physical or mechanical contact with the gate pad 10. Also, provided the thermally extensible material 36 is also conductive, an electrical connection is simultaneously formed between the gate pad 10 and the source pad 20.

In embodiments, at a rated operating temperature below the threshold value, the thermal expansion of the passive actuator 30 is limited to maintain at least a distance between the passive actuator 30 and the gate pad 10 that is predetermined to avoid any breakdown due to the electric field concentration at an extremity of the passive actuator 30 facing the gate pad 10.

In embodiments, the device further comprises means to limit the electric field concentration at the extremity of the passive actuator 30 facing the gate pad 10. Such means may include application of a dielectric gel such as SYLGARD™ 527 H Silicone Dielectric Gel on a surface of the passive actuator 30.

In embodiments the passive actuator 30 may be formed on the same substrate 40 as the source pad 20 and/or the gate pad 10. In embodiments the passive actuator 30 may extend from the substrate 40. Advantageously, the same manufacture chain can be used to manufacture the electronic switch and the passive actuator 30.

The passive actuator 30 may be thermally coupled to the source pad 20. In embodiments, the thermal coupling may be achieved by direct contact between the actuator 30 and the source pad 20, owing to the thermal properties of some known thermally extensible conductive materials. Therefore, the temperature at any given time in the passive actuator 30 is substantially uniform and equal to the temperature in the source pad 20, hence with the electronic switch. Advantageously, the passive actuator 30 is directly responsive to the temperature in the electronic switch.

The passive actuator 30 may be of the type of MEMS thermal actuators or thermal actuators manufactured using Micro-Electro-Mechanical systems technology or MEMs, which are microscopic devices that can produce movement. Such actuators in planar structures can produce movements in a plane and are readily integrated with other Micro-Electro-Mechanical system components.

Advantageously, thanks to using MEMS technology, manufacturing the passive actuator 30 may be a method step included in a method for manufacturing the electronic switch. In particular, the passive actuator 30 may be formed from the same metal than the gate and the source of the electronic switch, thus allowing for simple manufacturing steps.

Figure 2A:
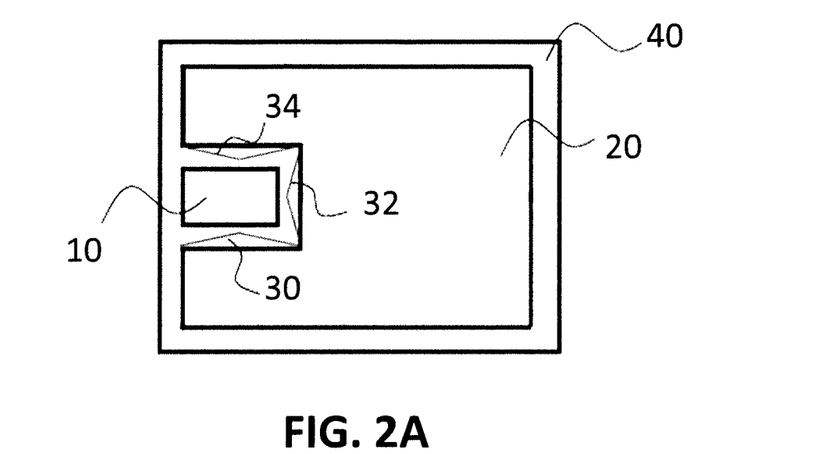
FIG. 2A depicts a top view of a device according to an embodiment of the invention at a normal operation temperature.
Figure 2B:
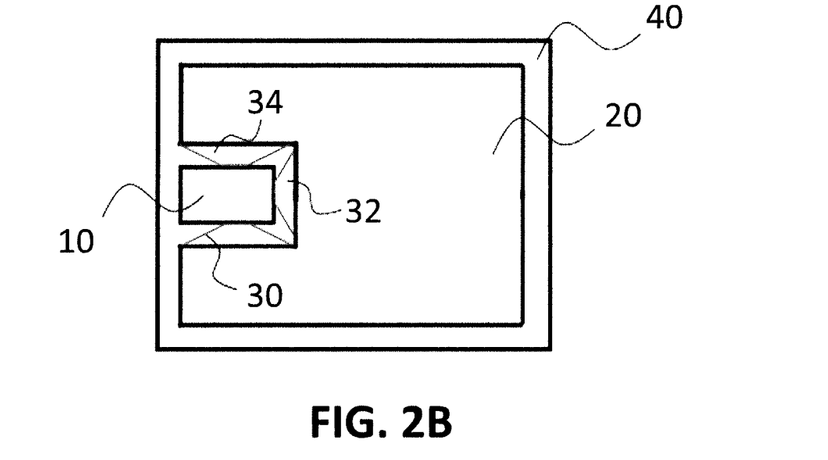
FIG. 2B depicts a top view of the device of FIG. 2A during an over-temperature event.
Figure 2C:
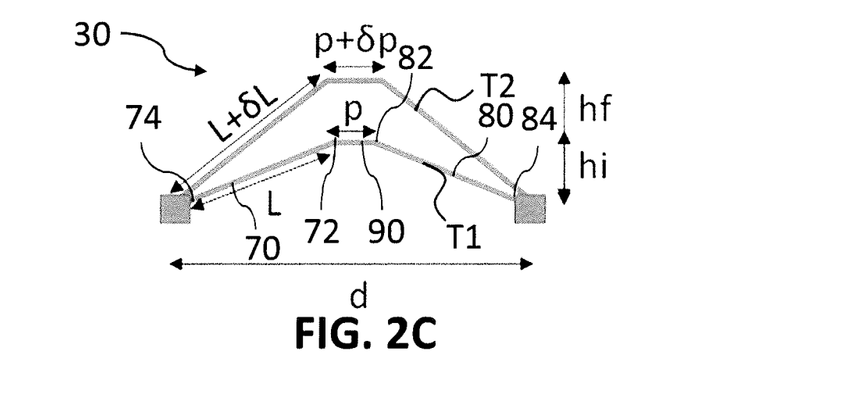
FIG. 2C depicts a schematic superimposition of two top views of part of a device according to an embodiment of the invention under respectively normal operation temperature conditions and during an over-temperature event.

As illustrated on FIG. 2C, the passive actuator 30 may be of the type of spring actuator MEMS. A spring actuator MEMS comprises at least a first arm 70 and a second arm 80, each aim 70, 80 being made with a thermally extensible material 36. The first arm 70 has two extremities 72, 74. The second arm 80 has two extremities 82, 84. The first extremities 72, 82 of the first and second arms are connected together, either directly or indirectly. The second extremities 74, 84 of the first and second anus are both connected to the source pad 20. The distance between the second extremities 74, 84 of the first and second arms 70, 80 connected to the source pad 20 is noted d and is fixed for all temperatures. Advantageously, owing to the triangular shape made from a two-point fixture, thermal elongation only occurs in one direction.

As illustrated by FIG. 2C, the passive actuator 30 may comprise a third arm 90 forming a junction between the first extremities 72, 82 of the first and second arms 70, 80, thus it reduces the electric field and consequently the contact bounce.

In embodiments, the device may further comprise an external circuit 50 (not represented) connected to the gate pad 10 and adapted to sense at least a parameter from which a temperature value or a temperature range in the passive actuator 30 may be derivable. The external circuit 50 may be further connected to the source pad 20. The external circuit 50 may for instance sense or monitor a current flowing through the gate pad 10, or a voltage between the gate pad 10 and another reference point of the circuit such as the source pad 20, or a wattage.

The external circuit 50 may be configured to detect a connection state between the gate pad 10 and the source pad 20 and to generate a signal based on the connection state. For example, when the passive actuator 30 forms an electrical connection between the gate pad 10 and the source pad 20, then the connection state between the gate pad 10 and the source pad 20 is on.

In embodiments, an electronic switch de-saturation condition may be detected by the external circuit 50 as an overcurrent through the gate—enabling a fault feedback state for the user. Thus, any possible heat source generated from an outside current is terminated and the electronic switch is placed in a safe mode for continued future operation once the cause of the over-temperature event has been repaired.

Figure 4:
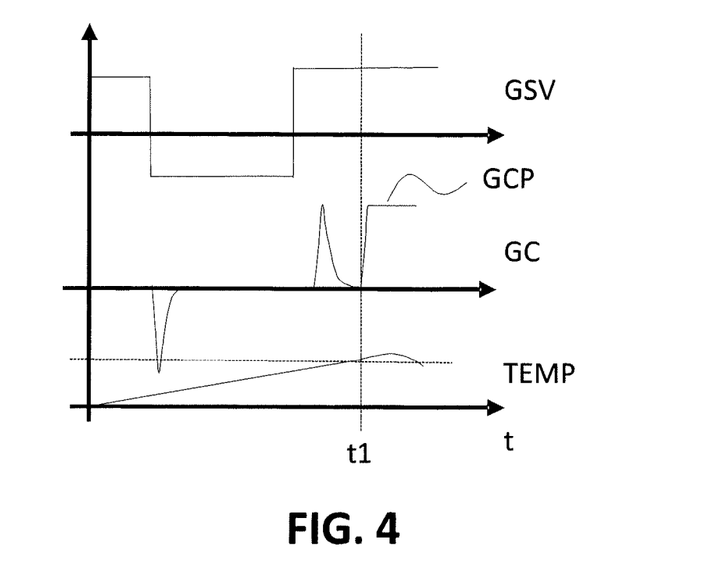
FIG. 4 depicts gate-source voltage, gate current and temperature as a function of time before and during an over temperature event in a device according to an embodiment of the invention.

FIG. 4 illustrates a possible implementation of the external circuit 50 allowing detection of an over-temperature event. FIG. 4 simultaneously depicts:
- a gate/source voltage GSV corresponding to a square wave voltage, corresponding to a classical control used in normal operation conditions, applied between the gate pad 10 and the source pad 20, as a function of time t;
- a gate current GC corresponding to a current flowing through the gate pad 10 as a function of time t, the gate current GC being due to applying the gate/source voltage GSV, and
- a temperature value TEMP in the passive actuator 30 thermally coupled to the electronic switch as a function of time t.

At the instant t1, the temperature value in the passive actuator 30 exceeds the threshold value and the passive actuator 30 forms a mechanical and electrical connection between the gate pad 10 and the source pad 20.

The current flowing through the gate is clamped at a certain value GCP, which is related to a combination of the gate/source voltage, a resistance value of the gate pad 10 and a resistance value of the passive actuator 30. In other words, the external circuit 50 may sense a plateau in the shape of the gate current flowing through the gate pad 10 and consider the plateau as a trigger for activating a signal.

The signal generated by the external circuit 50 may comprise an electrical signal to the mail controller, a signal for displaying an audio and/or visual warning that the electronic switch has been put in a safe mode as a consequence of an over-temperature event.

Alternately or additionally, the signal generated by the external circuit 50 may comprise a command signal for activating an external switch in order to shut down the gate/source voltage applied to the electronic switch.

In this sense, the user may be informed of a fault condition, in response to the passive actuator 30 automatically turning off the electronic switch due to the over-temperature fault.

In embodiments, the device may further comprise heating means 60 (not represented). The heating means 60 are adapted to maintain the passive actuator 30 above the threshold temperature under application of an actuator voltage above a predetermined level. Advantageously, the passive actuator 30 may be controlled to maintain the electronic switch in safe mode or off state. This safe mode may be maintained for example up until the external circuit 50 responds to a sensed signal by turning off the electronic switch.

The heating means 60 may comprise a resistance which value is adapted to generate a predetermined power of heating by Joule heating.

In embodiments, the passive actuator 30 comprises the heating means 60. Indeed, the passive actuator 30 may inherently comprise a resistance which value may be predetermined based on the gate to source voltage value, further based on the thermal resistance between the actuator and the environment, further based on the electrical conductivity of the material from which the passive actuator 30 is manufactured and further based on a geometrical parameter representative of the shape of the passive actuator 30.

In embodiments where the passive actuator 30 comprises a plurality of arms 70, 80 as illustrated on FIG. 2C, at least one arm 70 of the passive actuator 30 may have a predetermined width related to the resistance for heating the passive actuator 30 through Joule effect.

For instance, a suitable width to length ratio for a passive actuator 30 made in aluminum, titanium, gold, copper or silver may be in the range of 0.5% to 5%. Intermediate range values are 1%, 2%, 3% and 4%.

In embodiments, at least one arm 70, 80 of the passive actuator 30 has a width comprised between 4 and 40 μm. Intermediate range values are 5, 10, 15, 20, 25, 30 and 35 μm. Advantageously, the specific configuration of the arms 70, 80 allow heating the passive actuator 30 through Joule effect to maintain the mechanical and electrical connection as required by the application.

Advantageously, no additional means other than the passive actuator 30 are required to ensure the electronic switch is maintained in safe mode in case of an over-temperature event, resulting in a simple design keeping the manufacturing costs at a minimum.

According to embodiments, as illustrated on FIGS. 2A and 2B, the device may further comprise a plurality of passive actuators 30, 32, 34, each passive actuator 30, 32, 34 being arranged to form a reversible mechanical and electrical connection between the gate pad 10 and the source pad 20 only if the temperature in said passive actuator 30, 32, 34 exceeds a threshold value.

Each passive actuator 30, 32, 34 may be permanently connected and thermally coupled to points of the source pad 20 so as to surround the gate pad 10.

A first passive actuator 30 may be configured to connect the source pad 20 and the gate pad 10 only at any temperature exceeding a first threshold value.

A second passive actuator 32 may be configured to connect the source pad 20 and the gate pad 10 only at any temperature exceeding a second threshold value greater than the first threshold value.

In this embodiment, when the temperature in the electronic switch exceeds the first threshold value but does not exceed the second threshold value, gate current as a function of time plateaus at a first value. However, when the temperature in the electronic switch exceeds the second threshold value, gate current as a function of time plateaus at a second value.

Advantageously, the electronic switch temperature may be estimated in a discrete manner, such as by the external circuit 50, based on the amplitude of the gate current plateau.

According to embodiments, each passive actuator 30, 32, 34 has a different resistance.

Figure 5:
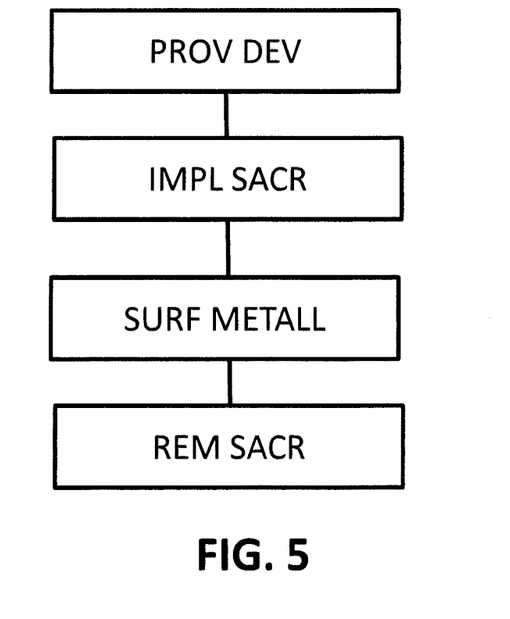
FIG. 5 depicts a flowchart of a method according to an embodiment of the invention.

As illustrated on FIG. 5, the invention also relates to a method for manufacturing the above device.

Figure 3A:
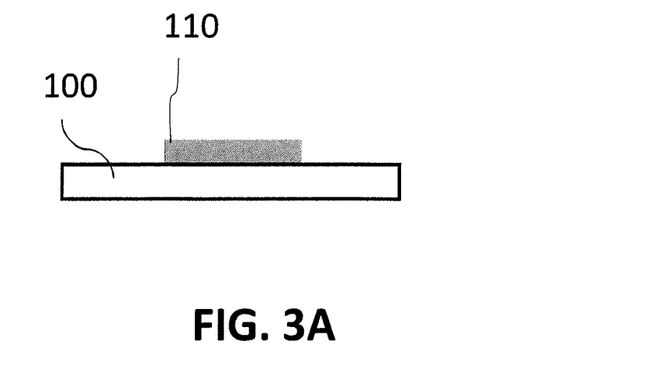
FIG. 3A depicts a successive step of a method according to an embodiment of the invention.
Figure 3B:
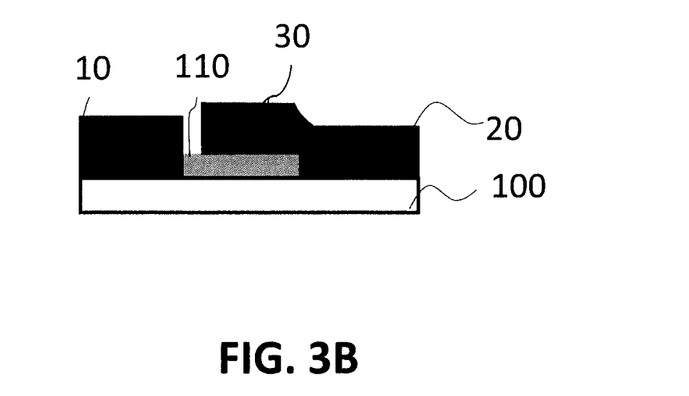
FIG. 3B depicts a successive step of a method according to an embodiment of the invention.
Figure 3C:
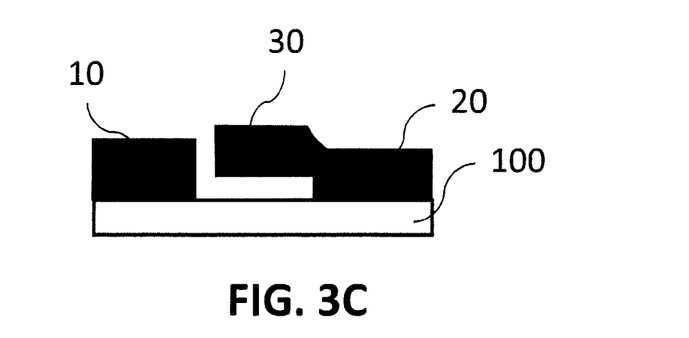
FIG. 3C depicts a successive step of a method according to an embodiment of the invention.

The method comprises:
- a device comprising a transistor region 100 is provided at the step PROV DEV;
- a sacrificial oxide 110 is implanted at the step IMPL SACR on part of a surface of the transistor region 100, as depicted on FIG. 3A;
- the surface of the transistor region 100 comprising the implanted sacrificial oxide 110 is metallized at the step SURF METALL to form the gate pad 10, the source pad 20 and the passive actuator 30, the passive actuator 30 extending over at least part of the sacrificial oxide 110, as depicted on FIG. 3B; and
- the sacrificial oxide is removed at the step REM SACR, as depicted on FIG. 3C, for example by a chemical attack.

The method may be implemented with a two-level MEMs technology, such as photolithography.

Example

The example herein corresponds to a more general embodiment illustrated by FIG. 2C. The passive actuator 30 is of the type of spring actuator MEMS and comprises a first arm 70, a second arm 80 and a third arm 90, each arm 70, 80, 90 are made of aluminum, which is a thermally extensible material 36 that is also conductive.

The first arm 70 has two extremities 72, 74.

The second arm 80 has two extremities 82, 84.

The first extremities 72, 82 of the first and second anus are connected together by the third arm 90.

The second extremities 74, 84 of the first and second arms are both connected to the source pad 20.

At ambient temperature T1, the length of the first and second arms 70, 80 is noted L, the length of the third arm 90 is noted p, and the height of the passive actuator 30 is noted hi. A given increase of temperature value up to a temperature T2 in the passive actuator 30 generates a corresponding elongation of the first and second arms 70, 80 noted δL and of the third arm 90 noted δp. The thermal expansion δL may be calculated using a linear relationship with the temperature change ΔT=T2−T1, the initial length L, and the linear expansion coefficient α which is dependent of the material. The thermal expansion δL may also be calculated from the initial length p of the third arm 90. The final height hf of the passive actuator 30 at a given temperature may then be defined by the equation (1):

$$hf = \sqrt{\left(\sqrt{(d^2 + hi^2)} \cdot (1 + \alpha \cdot \Delta T)\right)^2 - \left(\frac{d - p \cdot (1 + \alpha \cdot \Delta T)}{2}\right)^2} \quad (1)$$

In this example, the distance between the gate pad 10 and the source pad 20 is 150 μm. The length of the gate pad 10 is 1500 μm. The passive actuator 30 is made with aluminum, having a thermal expansion coefficient α of 24e-6/K. The distance d is equal to 1450 μm. The distance p is equal to 20 μM. The initial height hi is 127 μm at T1=25° C., then at T2=300° C. hf is equal to 150 μm, resulting in the gate pad 10 and the source pad 20 being connected together.

It should also be noted that under a rated operating temperature of 150° C., the distance between the passive actuator 30 and the gate pad 10 is sufficiently large enough, 11 μm, to avoid any breakdown due to the electric field concentration at the first extremities 72, 82 of the arms 70, 80 of the passive actuator 30, considering a dielectric strength of 17 V/μm.

The width of the arms 70, 80 is calculated in function of temperature rising, ΔT, of the passive actuator 30 by self-heating when the temperature of the passive actuator 30 exceeds the threshold value and the passive actuator 30 connects the gate pad 10 and the source pad 20.

The temperature rising can be controlled by the width of the arms 70, 80, noted w which can be designed for a certain gate driver voltage, noted V, a certain thickness of the arms 70, 80, noted ε, a certain material resistivity of the arms 70, 80, noted ρ, and a certain length of the arms 70, 80, noted l, and a certain thermal resistance of the arms 70, 80, noted Rth, as per (2).

$$\Delta T = \frac{Rth \cdot V^2 \cdot w \cdot \varepsilon}{\rho \cdot l} \quad (2)$$

A temperature rising of 40° C. is enough to maintain the electric connection of the passive actuator 30 reducing bouncing effects. Considering the following values: a thermal resistance between 500 mK/W and 50 mK/W, a gate voltage of 15V, a resistivity of 1.59×10⁻⁸ Ω·m, a thickness of 10 μm and a length of 725 μm, the width of the arms 70, 80 should be comprised between 4 and 40 μM, as per (3).

$$w = \frac{\Delta T \cdot \rho \cdot l}{Rth \cdot V^2 \cdot \varepsilon} = \frac{40 \cdot 1.59e - 8 \cdot 7.25 \mu}{[50, 500] m \cdot 15^2 \cdot 10 \mu} = [4, 40] \mu m \quad (3)$$

The invention has been described above with the aid of embodiments without limitation of the general inventive concept. Moreover, the embodiments of the invention may be combined without any restriction.

Many further modifications and variations will suggest themselves to those skilled in the art upon making reference to the foregoing illustrative embodiments, which are given by way of example only and which are not intended to limit the scope of the invention, that being determined solely by the appended claims.

In the claims, the word "comprising" does not exclude other elements or steps, and the indefinite article "a" or "an" does not exclude a plurality. The mere fact that different features are recited in mutually different dependent claims does not indicate that a combination of these features cannot be advantageously used. Any reference signs in the claims should not be construed as limiting the scope of the invention.

The invention claimed is:

1. A device comprising a gate pad, a source pad and a passive actuator, characterized in that the passive actuator is arranged to form a reversible mechanical and electrical connection between the gate pad and the source pad only if the temperature in the passive actuator exceeds a threshold value and the device further comprises a heater to maintain the passive actuator temperature above the threshold value under application of an actuator voltage above a predetermined level, wherein
   the gate pad and the source pad are components in a switch, and
   the threshold value is a value greater than an operating temperature of the switch and less than a temperature representing a failure of the switch.

2. The device according to claim 1, wherein the passive actuator comprises a thermally extensible conductive material extending at least from the source pad to the gate pad when the temperature in the passive actuator exceeds the threshold value.

3. The device according to claim 1, wherein the passive actuator is permanently connected and thermally coupled to the source pad.

4. The device according to claim 1, further comprising a substrate for supporting the gate pad and the source pad, wherein the passive actuator extends from the substrate.

5. The device according to claim 1, wherein the passive actuator extends from the source pad.

6. The device according to claim 1, wherein the passive actuator is manufactured using microelectromechanical system technology.

7. The device according to claim 1, further comprising an external circuit for detecting a connection state between the gate pad and the source pad and for generating a signal based on the connection state.

8. The device according to claim 1, wherein the heater comprises a resistance for heating the passive actuator through Joule effect.

9. The device of claim 1, further comprising a plurality of passive actuators, each passive actuator being arranged to form a reversible mechanical and electrical connection between the gate pad and the source pad only if the temperature in said passive actuator exceeds a respective threshold value which is different for each passive actuator.

10. A device comprising a gate pad, a source pad and a passive actuator, wherein the passive actuator is arranged to form a reversible mechanical and electrical connection between the gate pad and the source pad only if the temperature in the passive actuator exceeds a threshold value and the device further comprises a heater to maintain the passive actuator temperature above the threshold value under application of an actuator voltage above a predetermined level,
   where the passive actuator comprises two arms, each comprising a first and a second extremity, wherein the first extremities of each arm are connected together and the second extremities of each arm are each connected to a different point of the source pad.

11. The device according to claim 10, wherein the heater comprises a resistance for heating the passive actuator through Joule effect, wherein at least one arm of the passive actuator has a predetermined width related to the resistance for heating the actuator through Joule effect.

12. The device according to claim 10, wherein the heater comprises a resistance for heating the passive actuator through Joule effect, wherein at least one arm of the passive actuator has a width comprised between 4 and 40 µm.

* * * * *